US008368654B2

(12) United States Patent
Rosenblatt et al.

(10) Patent No.: US 8,368,654 B2
(45) Date of Patent: Feb. 5, 2013

(54) INTEGRATED TOUCH SENSOR AND SOLAR ASSEMBLY

(75) Inventors: Michael Nathaniel Rosenblatt, Campbell, CA (US); Benjamin Lyon, San Jose, CA (US); John Benjamin Filson, San Jose, CA (US); Steve Porter Hotelling, San Jose, CA (US); Gordon Cameron, Ottawa (CA); Cameron Frazier, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 732 days.

(21) Appl. No.: 12/242,723

(22) Filed: Sep. 30, 2008

(65) Prior Publication Data

US 2010/0078230 A1 Apr. 1, 2010

(51) Int. Cl.
*G06F 3/041* (2006.01)
(52) U.S. Cl. ..... 345/173; 345/174; 345/175; 178/18.06; 178/18.09; 136/206; 136/244
(58) Field of Classification Search .......... 345/173–183; 178/18.01–18.11; 136/206, 244
See application file for complete search history.

(56) References Cited

U.S. PATENT DOCUMENTS

| | | | | |
|---|---|---|---|---|
| 3,369,939 | A | * | 2/1968 | Myer ............................ 136/246 |
| 4,145,748 | A | * | 3/1979 | Eichelberger et al. ..... 178/18.01 |
| 4,543,443 | A | | 9/1985 | Moeller et al. |
| 5,105,186 | A | * | 4/1992 | May .............................. 345/175 |
| 5,160,920 | A | * | 11/1992 | Harris ............................ 345/52 |
| 5,457,289 | A | * | 10/1995 | Huang et al. .............. 178/18.08 |
| 5,483,261 | A | | 1/1996 | Yasutake |
| 5,488,204 | A | | 1/1996 | Mead et al. |
| 5,510,813 | A | * | 4/1996 | Makinwa et al. ............. 345/173 |
| 5,644,219 | A | * | 7/1997 | Kurokawa ...................... 136/293 |
| 5,825,352 | A | | 10/1998 | Bisset et al. |
| 5,835,079 | A | | 11/1998 | Shieh |
| 5,838,308 | A | * | 11/1998 | Knapp et al. .................. 345/173 |
| 5,869,956 | A | * | 2/1999 | Nagao et al. .................. 323/299 |
| 5,880,411 | A | | 3/1999 | Gillespie et al. |
| 5,982,302 | A | | 11/1999 | Ure |
| 6,188,391 | B1 | | 2/2001 | Sealy et al. |

(Continued)

FOREIGN PATENT DOCUMENTS

| | | |
|---|---|---|
| DE | 198 54 269 A1 | 6/2000 |
| EP | 0 967 511 A1 | 12/1999 |

(Continued)

OTHER PUBLICATIONS

International Search Report mailed Feb. 11, 2011, for PCT Application No. PCT/US2009/057856, filed Sep. 22, 2009, five pages.

(Continued)

*Primary Examiner* — Dorothy Harris
(74) *Attorney, Agent, or Firm* — Morrison & Foerster LLP

(57) ABSTRACT

Integrated touch sensor and solar panel configurations that may be used on portable devices, particularly handheld portable devices such as a media player or phone are disclosed. The integrated touch sensor array and solar cell stack-ups may include electrodes that are used both for collecting solar energy and for sensing on a touch sensor array. By integrating both the touch sensors and the solar cell layers into the same stack-up, surface area on the portable device may be conserved. In addition to being used for capacitive sensing, the integrated touch sensor and solar panel configurations may also be used for optical sensing.

30 Claims, 17 Drawing Sheets

U.S. PATENT DOCUMENTS

| | | | |
|---|---|---|---|
| 6,310,610 B1 | 10/2001 | Beaton et al. | |
| 6,323,846 B1 | 11/2001 | Westerman et al. | |
| 6,492,979 B1* | 12/2002 | Kent et al. | 345/173 |
| 6,504,530 B1* | 1/2003 | Wilson et al. | 345/173 |
| 6,559,479 B1 | 5/2003 | Ludemann | |
| 6,690,387 B2 | 2/2004 | Zimmerman et al. | |
| 6,967,700 B2 | 11/2005 | Wang et al. | |
| 7,015,894 B2 | 3/2006 | Morohoshi | |
| 7,184,064 B2 | 2/2007 | Zimmerman et al. | |
| 7,206,044 B2* | 4/2007 | Li et al. | 349/113 |
| 7,230,611 B2* | 6/2007 | Bischoff | 345/175 |
| 7,339,636 B2 | 3/2008 | Voloschenko et al. | |
| 7,663,607 B2 | 2/2010 | Hotelling et al. | |
| 2001/0020935 A1* | 9/2001 | Gelbman | 345/173 |
| 2002/0014262 A1* | 2/2002 | Matsushita et al. | 136/244 |
| 2004/0017524 A1 | 1/2004 | Li | |
| 2005/0110768 A1 | 5/2005 | Marriott et al. | |
| 2006/0026521 A1 | 2/2006 | Hotelling et al. | |
| 2006/0097991 A1 | 5/2006 | Hotelling et al. | |
| 2006/0197753 A1 | 9/2006 | Hotelling | |
| 2006/0202925 A1* | 9/2006 | Manning et al. | 345/87 |
| 2006/0260673 A1* | 11/2006 | Takeyama | 136/252 |
| 2007/0063982 A1* | 3/2007 | Tran | 345/173 |
| 2008/0094025 A1* | 4/2008 | Rosenblatt et al. | 320/101 |
| 2008/0303782 A1* | 12/2008 | Grant et al. | 345/156 |
| 2010/0079387 A1* | 4/2010 | Rosenblatt et al. | 345/173 |

FOREIGN PATENT DOCUMENTS

| | | |
|---|---|---|
| EP | 1 347 263 A1 | 9/2003 |
| JP | 2000-163031 A | 6/2000 |
| JP | 2002-342033 A | 11/2002 |
| WO | WO-2005/114369 A2 | 12/2005 |
| WO | WO-2005/114369 A3 | 12/2005 |
| WO | WO-2006/005116 A1 | 1/2006 |
| WO | WO-2008/085418 A2 | 7/2008 |
| WO | WO-2008/085418 A3 | 7/2008 |
| WO | WO-2008/085719 A2 | 7/2008 |
| WO | WO-2010/039498 A2 | 4/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," *CHI '92*, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

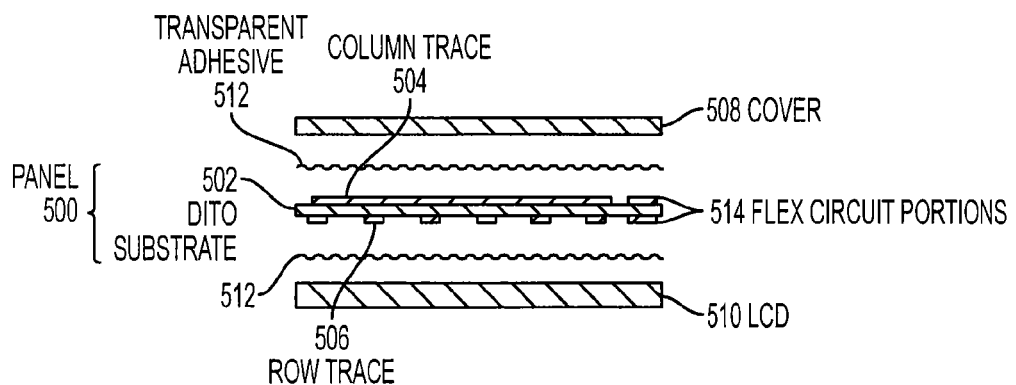
FIG. 5
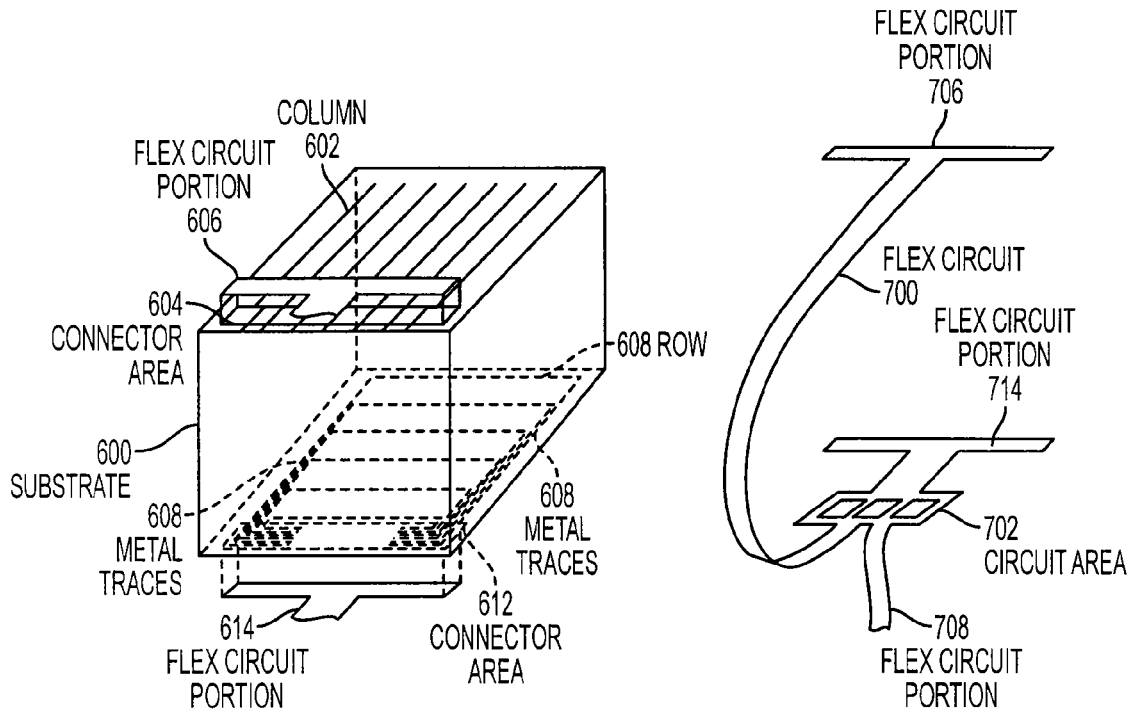
FIG. 6
FIG. 7

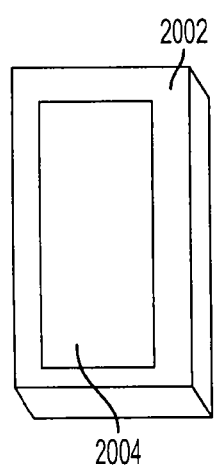
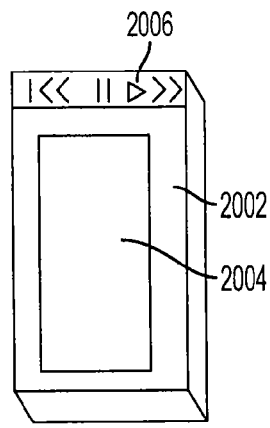
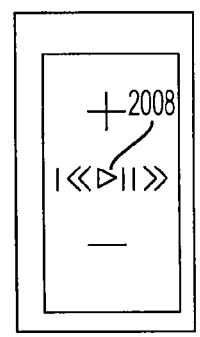
FIG. 20A  FIG. 20B  FIG. 20C
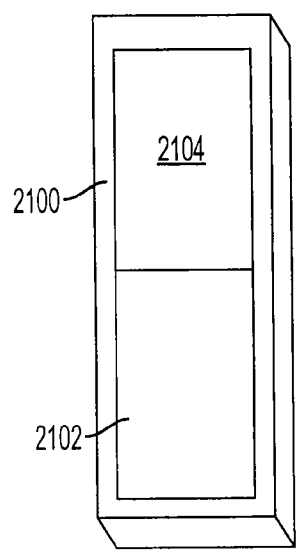
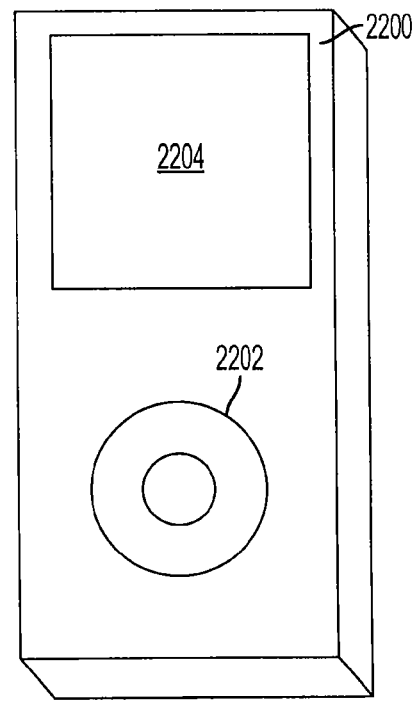
FIG. 21  FIG. 22

INTEGRATED TOUCH SENSOR AND SOLAR ASSEMBLY

FIELD OF THE INVENTION

This invention relates to touch sensors and solar cells, and more particularly, to integrated touch sensor array and solar cell stack-ups in which the same electrodes are used for collecting solar energy and for touch sensing.

BACKGROUND OF THE INVENTION

Many types of input devices are presently available for performing operations in a computing system, such as buttons or keys, mice, trackballs, touch panels, joysticks, touch screens and the like. Touch screens, in particular, are becoming increasingly popular because of their ease and versatility of operation as well as their declining price. Touch screens can include a touch panel, which can be a clear panel with a touch-sensitive surface. The touch panel can be positioned in front of a display screen so that the touch-sensitive surface covers the viewable area of the display screen. Touch screens can allow a user to make selections and move a cursor by simply touching the display screen via a finger or stylus. In general, the touch screen can recognize the touch and position of the touch on the display screen, and the computing system can interpret the touch and thereafter perform an action based on the touch event (the touching of fingers or other objects upon a touch-sensitive surface).

Touch panels can include an array of touch sensors capable of detecting touch events. Some touch panels may be able to detect multiple touches (the touching of fingers or other objects upon a touch-sensitive surface at distinct locations at about the same time) and near touches (fingers or other objects within the near-field detection capabilities of their touch sensors), and identify and track their locations. Examples of multi-touch panels are described in Applicant's co-pending U.S. application Ser. No. 10/842,862 entitled "Multipoint Touchscreen," filed on May 6, 2004 and published as U.S. Published Application No. 2006/0097991 on May 11, 2006, the contents of which are incorporated by reference herein.

Virtually all portable devices rely on electrical power in one form or another. Some of them rely on various types of batteries which store energy in chemical forms. Some batteries are disposable and they produce only a certain fixed amount of electrical power from the stored energy. Some batteries, such as nickel-cadmium NiMH (Nickel Metal Hydride) or lithium-ion batteries, may be recharged, but they also generate only a finite amount of electrical energy between recharges. For devices such as portable music players, when they are in continual use, they can be used for about 10 or 20 hours, or often much less, before their batteries need to be replaced or recharged.

Using solar cells on portable devices, particularly handheld portable devices with small form factors, however, poses certain technical and/or design problems. For example, the small size of the portable device means there is a small surface area which can be used for placing solar cells. This surface area is typically further reduced by other components that appear on the surfaces of the devices such as input devices and display devices. Since the maximum solar energy that can be produced from a solar panel is roughly proportional to the surface area of the solar cells, this reduces the amount of solar energy that may be gained from the solar panel.

FIG. 1 shows a handheld calculator 102 with a built-in solar cell 104. The solar cell or solar panel 104 is embedded on the front of the device. The calculator includes a display 106 and an area for user input, which comprises multiple keys 108. It should be noted that the upper area of the device used for the solar panel could have been used for other purposes, for example, for a bigger display or input area. Alternatively, the overall size of the device could have been reduced were it not for the solar panel.

SUMMARY OF THE INVENTION

This relates to integrated touch sensor and solar panel configurations that may be used on portable devices, particularly handheld portable devices such as a media player or phone. The integrated touch sensor array and solar cell stack-ups may include electrodes that are used both for collecting solar energy and for sensing on a touch sensor array. By integrating both the touch sensors and the solar cell layers into the same stack-up, surface area on the portable device may be conserved.

The integrated touch sensor and solar panel may include electrodes that provide the same coverage as a typical solar panel electrode, but provides far more quadrants or pixels that may be used as touch sensors. The electrode terminals may be connected in parallel in order to draw power from the cell during a solar power cycle. The terminals may then be connected as separate quadrants during a touch sensor cycle. A multiplexer (MUX) may be used to selectively switch between power conversion circuitry and touch sensing circuitry during power and touch sensing cycles respectively.

In addition to being used for capacitive sensing, the integrated touch sensor and solar panel configurations may also be used for optical sensing. Unlike the capacitive sensing, the optical sensing may be accomplished simultaneously with power production. Accordingly, optical sensing may be used to increase the amount of time that the solar panel is used to produce energy.

For example, the solar panel may operate in a solar power and optical sensing mode. When an approaching object, such as a finger, is detected the solar panel may switch to a capacitive sensing mode to more precisely locate the object. Alternatively, the solar panel may cycle between solar power/optical sensing mode and capacitive sensing mode. When no object is detected by optical sensing or capacitive sensing the number of capacitive cycles in a given time interval may be decreased to maximize the amount of time the solar panel is used to produce energy. When an approaching object is detected using either optical sensing or capacitive sensing, the number of capacitive sensing cycles in a given time period may be increased to provide better accuracy and response for the capacitive sensing.

BRIEF DESCRIPTION OF THE DRAWINGS

FIG. 5 illustrates an exemplary capacitive touch sensor panel fabricated using a double-sided ITO (DITO) substrate having column and row ITO traces formed on either side of the substrate, and bonded between a cover and a LCD using transparent adhesive according to some embodiments of this invention.

FIG. 6 is an exploded perspective view of an exemplary DITO substrate (with its thickness greatly exaggerated for purposes of illustration only) with columns and rows formed on either side according to some embodiments of this invention.

FIG. 7 illustrates an exemplary flex circuit according to some embodiments of this invention, including flex circuit portions for connecting to the row and column traces, respectively, on either side of a DITO substrate, and a flex circuit portion for connecting to a host processor.

FIG. 20a illustrates an exemplary handheld media player including an integrated touch sensor solar cell panel surface.

FIG. 20b illustrates an exemplary handheld media player including an integrated touch sensor solar cell panel surface and LED indicators on a front surface of the handheld media player.

FIG. 20c illustrates an exemplary handheld media player including an integrated touch sensor solar cell panel surface and embossed icons on a front surface of the handheld media player.

FIG. 21 illustrates an exemplary handheld media player including an integrated touch sensor solar cell panel surface and an integrated touch sensor LCD display surface on a front surface of the handheld media player.

FIG. 22 illustrates an exemplary handheld media player including an integrated touch sensor solar cell panel surface and a LCD display surface on a front surface of the handheld media player.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Described are integrated touch sensor and solar panel configurations that may be used on portable devices, particularly handheld portable devices such as a media player or phone. The integrated touch sensor array and solar cell stack-ups may include electrodes that are used both for collecting solar energy and for sensing on a touch sensor array. By integrating both the touch sensors and the solar cell layers into the same stack-up, surface area on the portable device may be conserved.

Figure 1:
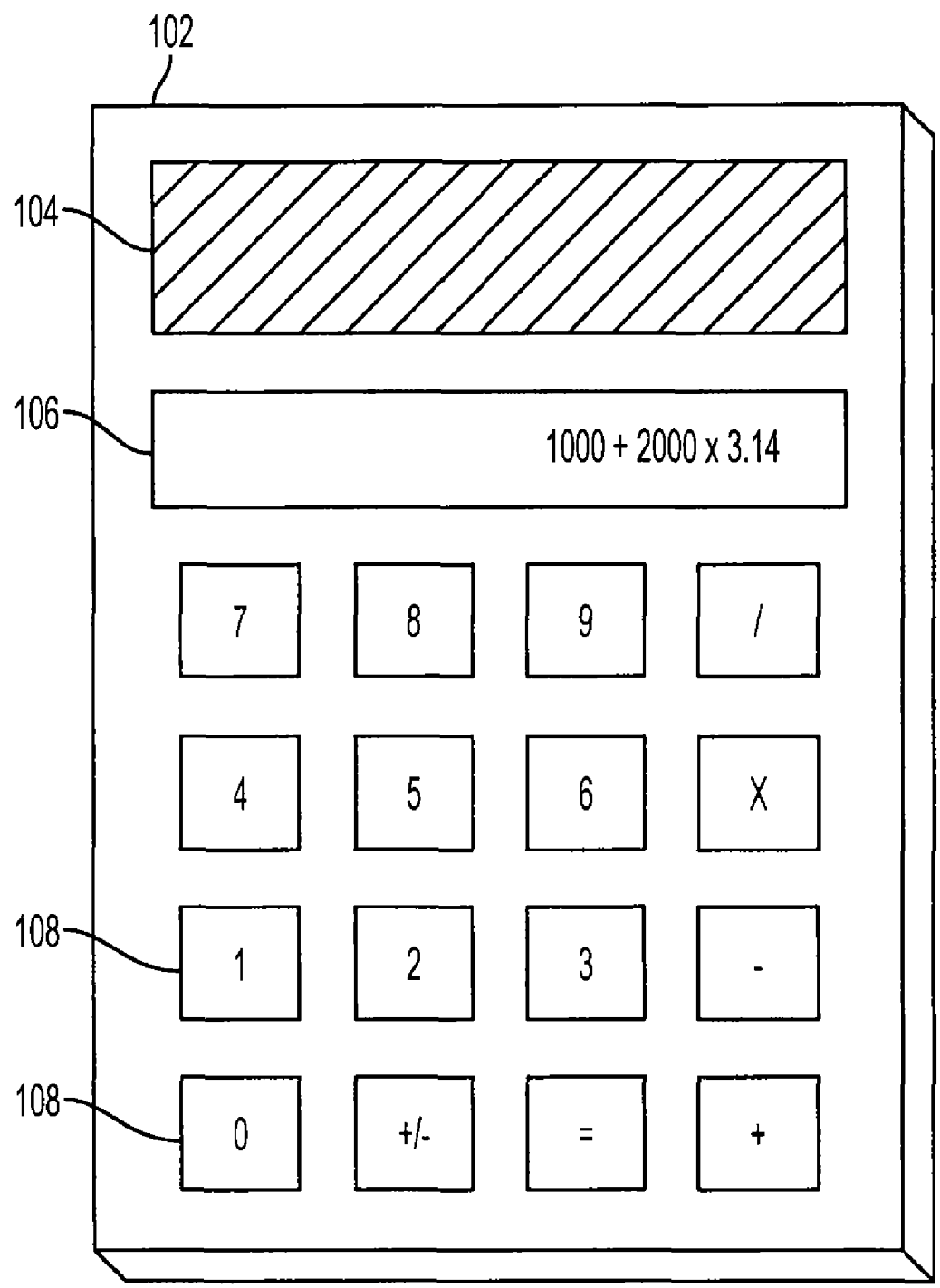
FIG. 1 shows a prior art handheld calculator with a built-in solar cell on the front.
Figure 2:
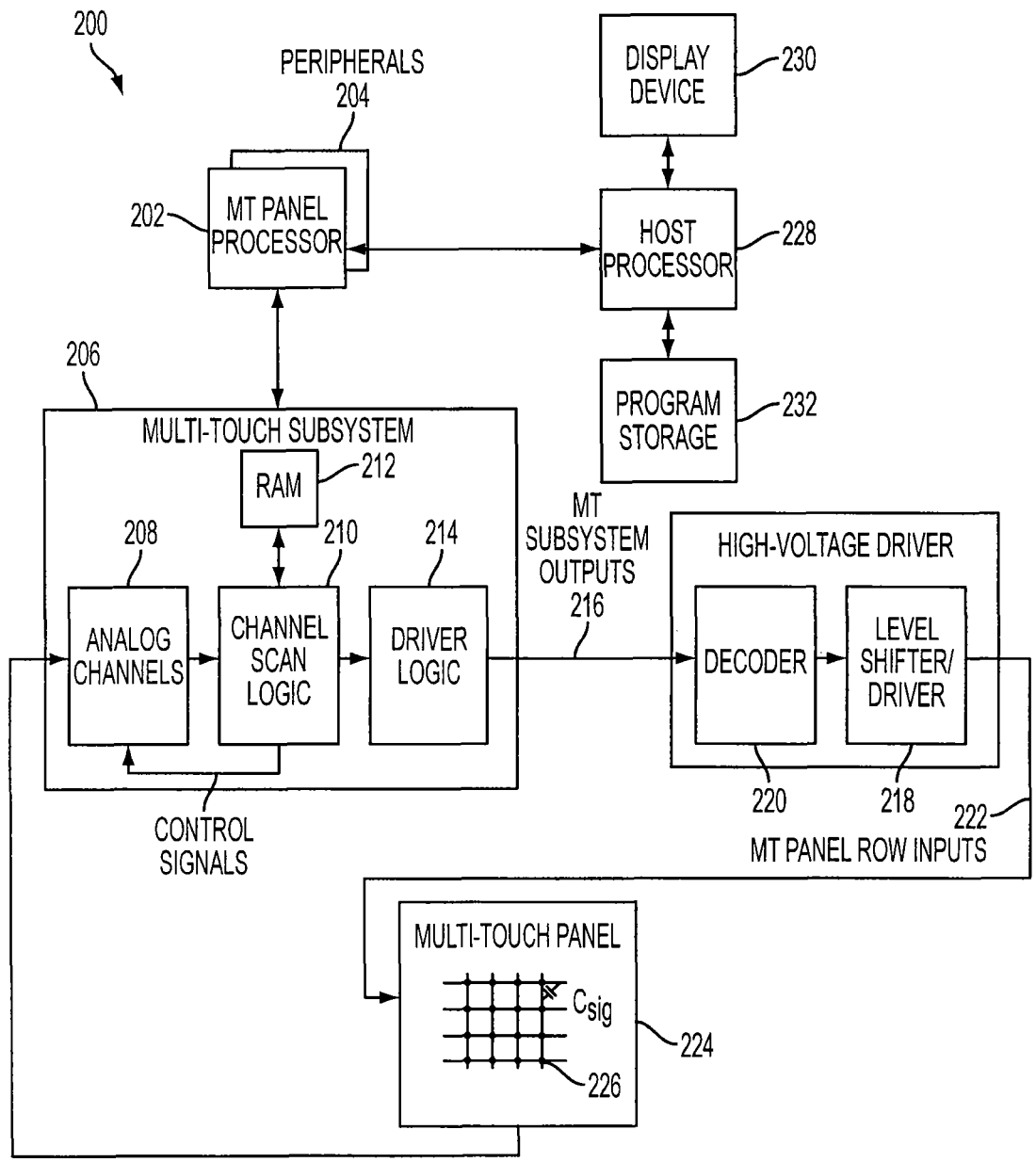
FIG. 2 illustrates an exemplary computing system operable with a capacitive multi-touch sensor panel according to some embodiments of this invention.

Multi-touch sensor panels and their associated touch sensor panel circuitry may be able to detect multiple touches (touch events or contact points) that occur at about the same time, and identify and track their locations. FIG. 2 illustrates exemplary computing system 200 operable with capacitive multi-touch sensor panel 224 according to embodiments of this invention. Multi-touch sensor panel 224 can be created using a substrate with column and row traces formed on either side of the substrate using a novel fabrication process. Flex circuits can be used to connect the column and row traces on either side of the touch sensor panel to its associated touch sensor panel circuitry. Traces made of copper or other highly conductive metals running along the edge of the substrate can be used to bring the row traces to the same edge of the substrate as the column traces so that the flex circuits can be bonded to the same edge of the substrate on directly opposing sides of the substrate, minimizing the area needed for connectivity and reducing the overall size of the touch sensor panel. A single flex circuit can be fabricated to connect to the rows and columns on directly opposing sides at the same edge of the substrate. Furthermore, the row traces can be widened to shield the column traces from a modulated Vcom layer.

Computing system 200 can include one or more panel processors 202 and peripherals 204, and panel subsystem 206. The one or more processors 202 can include, for example, an ARM968 processor or other processors with similar functionality and capabilities. However, in other embodiments, the panel processor functionality can be implemented instead by dedicated logic such as a state machine. Peripherals 204 can include, but are not limited to, random access memory (RAM) or other types of memory or storage, watchdog timers and the like.

Panel subsystem 206 can include, but is not limited to, one or more analog channels 208, channel scan logic 210 and driver logic 214. Channel scan logic 210 can access RAM 112, autonomously read data from the analog channels and provide control for the analog channels. This control can include multiplexing columns of multi-touch panel 224 to analog channels 208. In addition, channel scan logic 210 can control the driver logic 214 and stimulation signals being selectively applied to rows of multi-touch panel 224. In some embodiments, panel subsystem 206, panel processor 202 and peripherals 204 can be integrated into a single application specific integrated circuit (ASIC).

Driver logic 214 can provide multiple panel subsystem outputs 216 and can present a proprietary interface that drives the high voltage driver, which is comprised of decoder 220 and subsequent level shifter and driver stage 218, although level-shifting functions could be performed before decoder functions. Level shifter and driver 218 can provide level shifting from a low voltage level (e.g. CMOS levels) to a higher voltage level, providing a better signal-to-noise (S/N) ratio for noise reduction purposes. Decoder 220 can decode the drive interface signals to one out of N outputs, whereas N is the maximum number of rows in the panel. Decoder 220 can be used to reduce the number of drive lines needed between the high voltage driver and panel 224. Each panel row input 222 can drive one or more rows in panel 224. In some embodiments, driver 218 and decoder 220 can be integrated into a single ASIC. However, in other embodiments, driver 218 and decoder 220 can be integrated into driver logic 214, and in still other embodiments, driver 218 and decoder 220 can be eliminated entirely.

Computing system 200 can also include host processor 228 for receiving outputs from panel processor 202 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to panel processing, and can be coupled to program storage 232 and display device 230 such as a liquid crystal display (LCD) for providing a UI to a user of the device.

As mentioned above, multi-touch panel 224 can in some embodiments include a capacitive sensing medium having a plurality of row traces or driving lines and a plurality of column traces or sensing lines (although other sensing media may also be used) separated by a dielectric. Alternatively, the drive lines and sense lines can be formed adjacent to or near each other on the same layer on a single side of a substrate.

In some embodiments, the dielectric material that separates the column traces and sense traces can be transparent, such as glass, or can be formed from other materials such as Mylar, Polyimide, and other PCB materials. The row and column traces can be formed from a transparent conductive medium such as indium tin oxide (ITO) or antimony tin oxide (ATO), although other transparent or non-transparent materials such as copper or conductive ink can also be used. In some embodiments, the row and column traces can be perpendicular to each other, although in other embodiments other non-orthogonal and non-Cartesian orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis," as may be used herein are intended to encompass not only orthogonal grids, but the intersecting traces of other geometric configurations having first and second dimensions (e.g. the concentric and radial lines of a polar-coordinate arrangement).

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as picture element (pixel) 226, which can be particularly useful when multi-touch panel 224 is viewed as capturing an "image" of touch. (In other words, after multi-touch subsystem 206 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 224 can drive one or more analog channels 208 (also referred to herein as event detection and demodulation circuits) in multi-touch subsystem 206. In some embodiments, each column is coupled to one dedicated analog channel 208. However, in other embodiments, the columns may be couplable via an analog switch to a fewer number of analog channels 208.

Figure 3A:
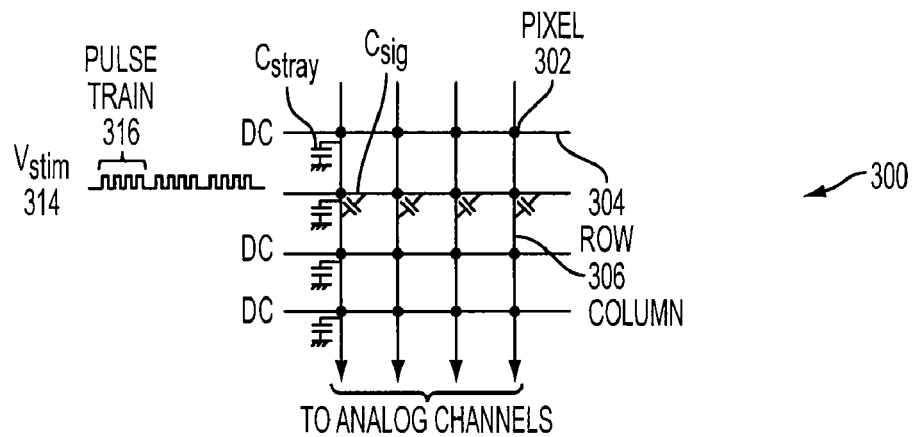
FIG. 3a illustrates an exemplary capacitive multi-touch panel according to some embodiments of this invention.

FIG. 3a illustrates exemplary capacitive multi-touch panel 300. FIG. 3a indicates the presence of a stray capacitance Cstray at each pixel 302 located at the intersection of a row 304 and a column 306 trace (although Cstray for only one column is illustrated in FIG. 2 for purposes of simplifying the figure). Note that although FIG. 3a illustrates rows 304 and columns 306 as being substantially perpendicular, they need not be so aligned, as described above. In the example of FIG. 3a, AC stimulus Vstim 314 is being applied to one row, with all other rows connected to DC. The stimulus causes a charge to be injected into the column electrodes through mutual capacitance at the intersecting points. This charge is Qsig=Csig×Vstm. Each of columns 306 may be selectively connectable to one or more analog channels (see analog channels 208 in FIG. 2).

Figure 3B:
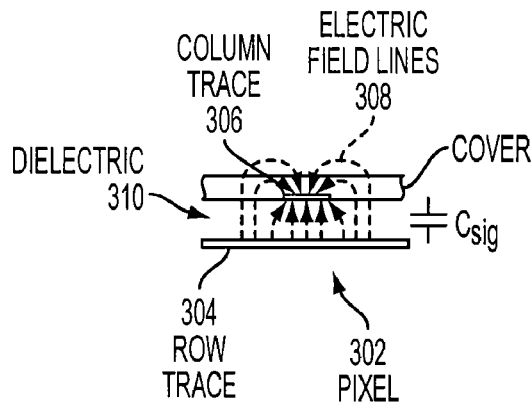
FIG. 3b is a side view of exemplary pixel in a steady-state (no-touch) condition according to some embodiments of this invention.

FIG. 3b is a side view of exemplary pixel 302 in a steady-state (no-touch) condition. In FIG. 3b, an electric field of electric field lines 308 of the mutual capacitance between column 306 and row 304 traces, or electrodes separated by dielectric 310, is shown.

Figure 3C:
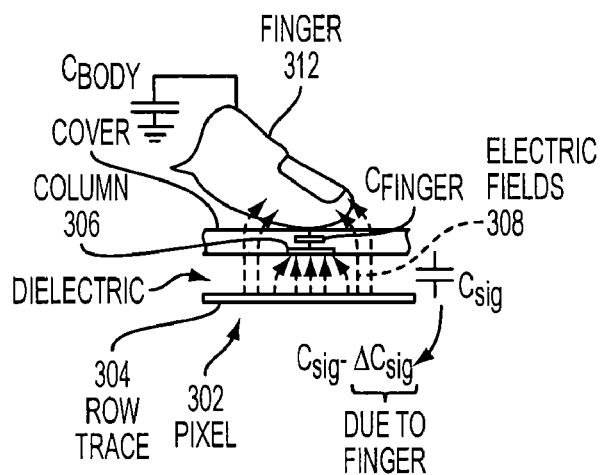
FIG. 3c is a side view of exemplary pixel in a dynamic (touch) condition according to some embodiments of this invention.

FIG. 3c is a side view of exemplary pixel 302 in a dynamic (touch) condition. In FIG. 3c, finger 312 has been placed near pixel 302. Finger 312 is a low-impedance object at signal frequencies, and has an AC capacitance Cfinger from the column trace 304 to the body. The body has a self-capacitance to ground Cbody of about 200 pF, where Cbody is much larger than Cfinger. If finger 312 blocks some electric field lines 308 between the row and column electrodes (those fringing fields that exit the dielectric and pass through the air above the row electrode), those electric field lines are shunted to ground through the capacitance path inherent in the finger and the body, and as a result, the steady state signal capacitance Csig is reduced by ΔCsig. In other words, the combined body and finger capacitance act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel becomes Csig−ΔCsig, where Csig represents the static (no touch) component and ΔCsig represents the dynamic (touch) component. Note that Csig−ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Referring again to FIG. 3a, as mentioned above, Vstim signal 314 can be applied to a row in multi-touch panel 300 so that a change in signal capacitance can be detected when a finger, palm or other object is present. Vstim signal 314 can be generated as one or more pulse trains 316 at a particular frequency, with each pulse train including a number of pulses. Although pulse trains 316 are shown as square waves, other waveshapes such as sine waves can also be employed. A plurality of pulse trains 316 at different frequencies can be transmitted for noise reduction purposes to detect and avoid noisy frequencies. Vstim signal 314 essentially injects a charge into the row, and can be applied to one row of multi-touch panel 300 at a time while all other rows are held at a DC level. However, in other embodiments, the multi-touch panel can be divided into two or more sections, with Vstim signal 314 being simultaneously applied to one row in each section and all other rows in that region section held at a DC voltage.

Each analog channel coupled to a column measures the mutual capacitance formed between that column and the row. This mutual capacitance is comprised of the signal capacitance Csig and any change Csig_sense in that signal capacitance due to the presence of a finger, palm or other body part or object. These column values provided by the analog channels may be provided in parallel while a single row is being stimulated, or may be provided in series. If all of the values representing the signal capacitances for the columns have been obtained, another row in multi-touch panel 300 can be stimulated with all others held at a DC voltage, and the column signal capacitance measurements can be repeated. Eventually, if Vstim has been applied to all rows, and the signal capacitance values for all columns in all rows have been captured (i.e. the entire multi-touch panel 300 has been "scanned"), a "snapshot" of all pixel values can be obtained for the entire multi-touch panel 300. This snapshot data can be initially saved in the multi-touch subsystem, and later transferred out for interpretation by other devices in the computing system such as the host processor. As multiple snapshots are obtained, saved and interpreted by the computing system, it is possible for multiple touches to be detected, tracked, and used to perform other functions.

As described above, because the rows may be either stimulated with an AC signal or held at a DC voltage level, and because the columns need to be connected to analog channels so that modulated output signals can be detected, demodulated and converted to output values, electrical connections must be formed with the rows and columns on either side of the dielectric of the touch sensor panel.

Figure 4:
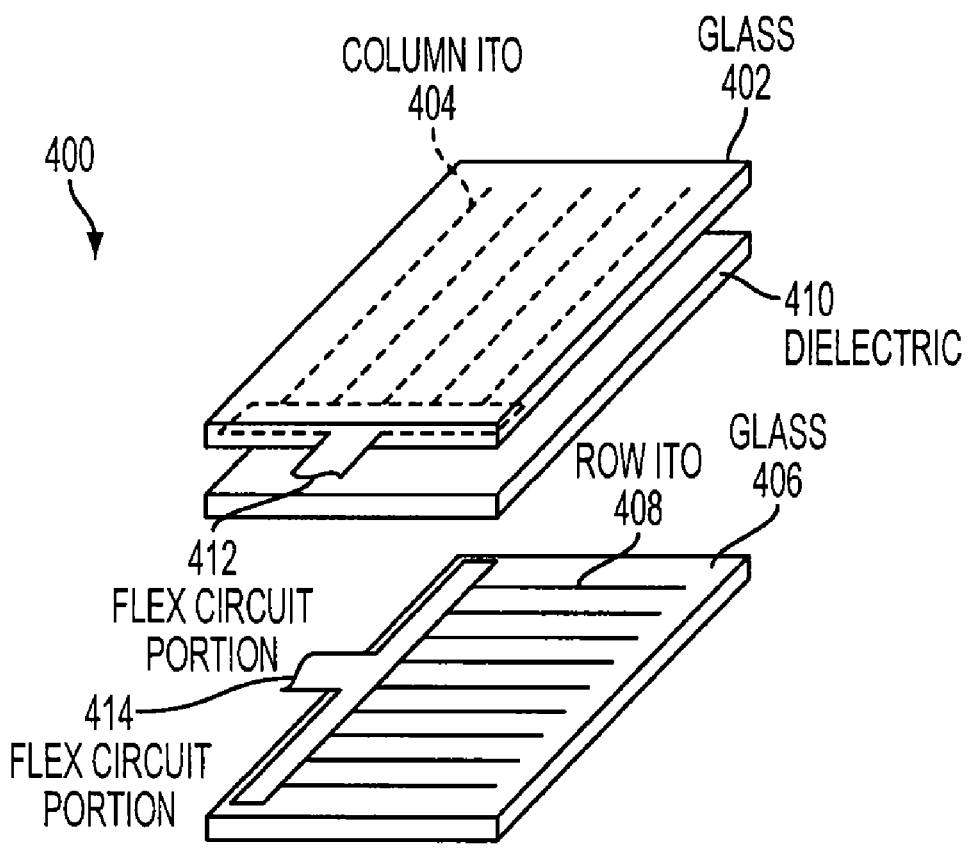
FIG. 4 is an exploded perspective view of an exemplary capacitive touch sensor panel formed from a top layer of glass upon which transparent column traces of ITO have been etched, and a bottom layer of glass upon which row traces of ITO have been etched.

FIG. 4 is an exploded perspective view of an exemplary capacitive touch sensor panel 400 formed from a top layer of glass 402 upon which transparent column traces of ITO 404 have been etched, and a bottom layer of glass 406 upon which row traces of ITO 408 have been etched. The top and bottom glass layers 402 and 406 are separated by a clear polymer spacer 410 that acts as a dielectric between the row and column traces. Because the rows and columns are perpendicular to each other, the most straightforward way to connect these rows and columns is to bond flex circuit 412 at one edge of the touch sensor panel, and bond another flex circuit 414 on an adjacent edge of the touch sensor panel. However, because the connection areas for these flex circuits 412 and 414 are not on the same edge of touch sensor panel 400 and are not on directly opposing sides of dielectric 410, the touch sensor panel must be made larger to accommodate these two non-overlapping connection areas.

Capacitive touch sensor panels typically form the row and column traces on two pieces of glass as shown in FIG. 4 because it has not been practical to form column and row traces on either side of a single substrate. Conventional methods for forming ITO traces on one side of a substrate require that the substrate be placed on rollers during the fabrication process. However, if the substrate is then flipped over to form ITO traces on the second side, the rollers will damage any traces previously formed on the first side of the substrate. Furthermore, when etching is used to etch away part of the ITO to form traces on one side of the substrate, the entire substrate is conventionally placed in an etching bath, which will etch away any traces previously formed on the other side of the substrate.

FIG. 5 illustrates an exemplary capacitive touch sensor panel 500 fabricated using a double-sided ITO (DITO) substrate 502 having column and row ITO traces 504 and 506, respectively, formed on either side of the substrate, and bonded between cover 508 and LCD 510 using transparent adhesive 512 according to embodiments of this invention. Substrate 502 can be formed from glass, plastic, hybrid glass/plastic materials, and the like. Cover 508 can be formed from glass, acrylic, sapphire, and the like. To connect to column and row traces 504 and 506, respectively, two flex circuit portions 514 can be bonded to directly opposing sides at the same edge of DITO 502, although other bonding locations may also be employed.

FIG. 6 is an exploded perspective view of an exemplary DITO substrate 600 (with its thickness greatly exaggerated for purposes of illustration only) with columns 602 and rows 608 formed on either side according to embodiments of this invention. Some of column ITO traces 602 on the top side are routed to a necked-down connector area 604, where they are brought off the panel by a flex circuit portion 606 that can be conductively bonded to the top of DITO substrate 600. In some embodiments, row ITO traces 608 on the bottom side can be connected to thin metal traces 610 that run alongside the edges of the bottom side. Metal traces 610 can be routed to connector area 612, which can be directly opposing connector area 604, or at least on the same edge of DITO substrate 600 as connector area 604. Providing connector areas 604 and 612 at the same edge of DITO substrate 600 can allow the substrate and therefore the product to be smaller. Another flex circuit portion 614 can be used to bring row ITO traces 608 off the panel.

Column and row ITO traces 602 and 608 can be formed on both sides of DITO substrate 600 using several fabrication methods. In one embodiment, a substrate can be placed on the rollers of the fabrication machinery and a layer of ITO can be sputtered onto a first side of DITO substrate 600 and etched (e.g. using photolithography techniques) to form column traces 602. A protective coating of photoresist (e.g. two layers of photoresist) can then be applied over the column traces 602, and DITO substrate 600 can be flipped over so that the rollers make contact only with the applied photoresist on the first side and not the formed column traces. Another layer of ITO can then be sputtered onto the now-exposed back side of DITO substrate 600 and etched to form row traces 608.

If no metal traces 610 are required, the photoresist on the first side can be stripped off to complete the process. However, if metal traces 610 are required at the edges to connect to row traces 608 and bring them to a particular edge of the substrate, a protective coating of photoresist (e.g. two layers of photoresist) can be applied over row traces 608, leaving the edges exposed. A metal layer can then be sputtered over the photoresist and exposed edges, and the metal layer can then be etched to form metal traces 610 at the edges. Finally, all remaining layers of photoresist can be stripped off.

Minor variations to the process described above can also be made. For example, the second side of the DITO substrate patterning may be formed by first patterning a photoresist using very simple geometry to cover only the interior region of the second side of the DITO substrate while leaving the edge regions exposed. For this variation, metal is sputtered first and then the photoresist with simple geometry is then stripped off to leave metal in the edge regions only. Then the ITO is sputtered over the entire second side of the DITO substrate. A second photoresist is applied and patterned to form the mask for the electrode patterns. A series of etching steps is then used to form the electrode pattern in the topmost ITO layer and metal layer underneath. The first etching steps etches the ITO only, and the second etch steps etches the metal layer only which produces the desired electrode geometry.

FIG. 7 illustrates an exemplary flex circuit 700 according to embodiments of this invention, including flex circuit portions 706 and 714 for connecting to the row and column traces, respectively, on either side of a DITO substrate, and flex circuit portion 708 for connecting to a host processor. Flex circuit 700 includes a circuit area 702 upon which the multi-touch subsystem, multi-touch panel processor, the high voltage driver and decoder circuitry (see FIG. 2), an EEPROM and some essential small components such as bypass capacitors can be mounted and connected to save space. Circuit area 702 may be shielded by an EMI can (not shown) which encloses circuit area 702 using top and bottom shield portions. The bottom can may be adhered to a structure of the device to secure the circuit area. From this circuit area 702, flex circuit 700 may connect to the top of the DITO substrate via flex circuit portion 706, to the bottom of the DITO substrate via flex circuit portion 714, and to a host processor via flex circuit portion 708.

The present invention generally relates to various methods and systems for producing an integrated solar cells and touch sensor stack-up. The integrated solar cell and touch sensor stack-up may be utilized in portable devices such as PDAs, phones and media players. According to embodiments of the invention, the devices have rechargeable batteries. The integrated solar cell and touch sensor stack-up embedded into the device may then provide electrical power to charge the batteries. The power generated from the solar cell can also directly power the operations of the device. This is illustrated in FIG. 8.

Figure 8:
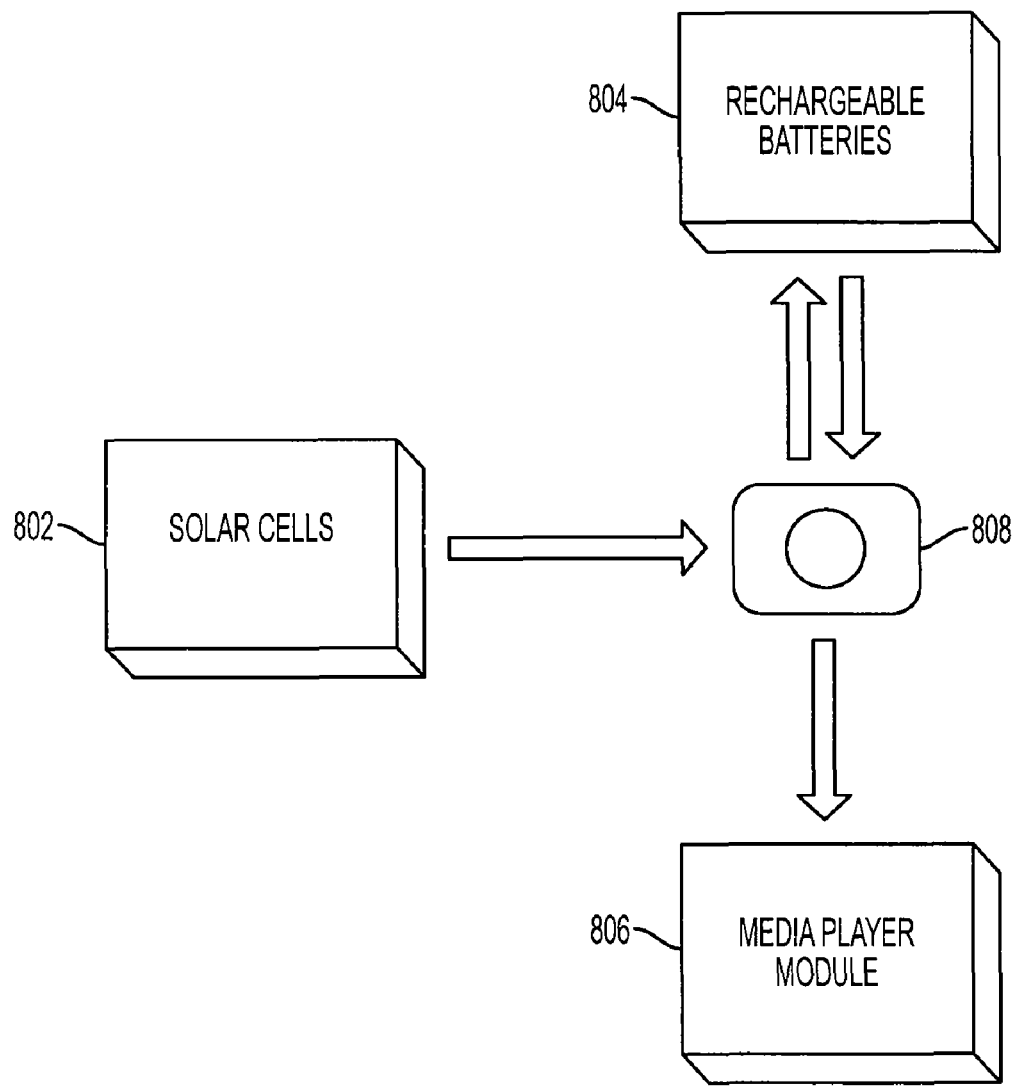
FIG. 8 is an exemplary block diagram illustrating various functional modules according to some embodiments this invention.

FIG. 8 depicts a block diagram illustrating various functional modules according to an embodiment of the present invention. It includes one or more solar cells 802, one or more rechargeable batteries 804 and a main operational module 806 of the device. In this example, the device's main function is assumed to be that of playing digital media such as music or video. The switch or gateway 808 is a schematic representation of a (virtual) unit responsible for the "traffic control" of the electricity flow in the device. This unit may or may not be a concrete unit including circuit elements. In some embodiments, this circuitry 808 may contain a boost converter to change the voltage coming from the solar cells 802 to a value suitable for the batteries 804 or the main unit 806. The arrows in the figure represent the possible flow of electricity. The electric power generated from the solar cells 802 can be used either to charge the rechargeable batteries 804 or to directly power the main module 806, or both. The main module can also be powered directly by the batteries 804 as indicated by the arrows. The rechargeable batteries can be charged by the solar cells 802 as well as external power sources (not shown in the figure).

Figure 9:
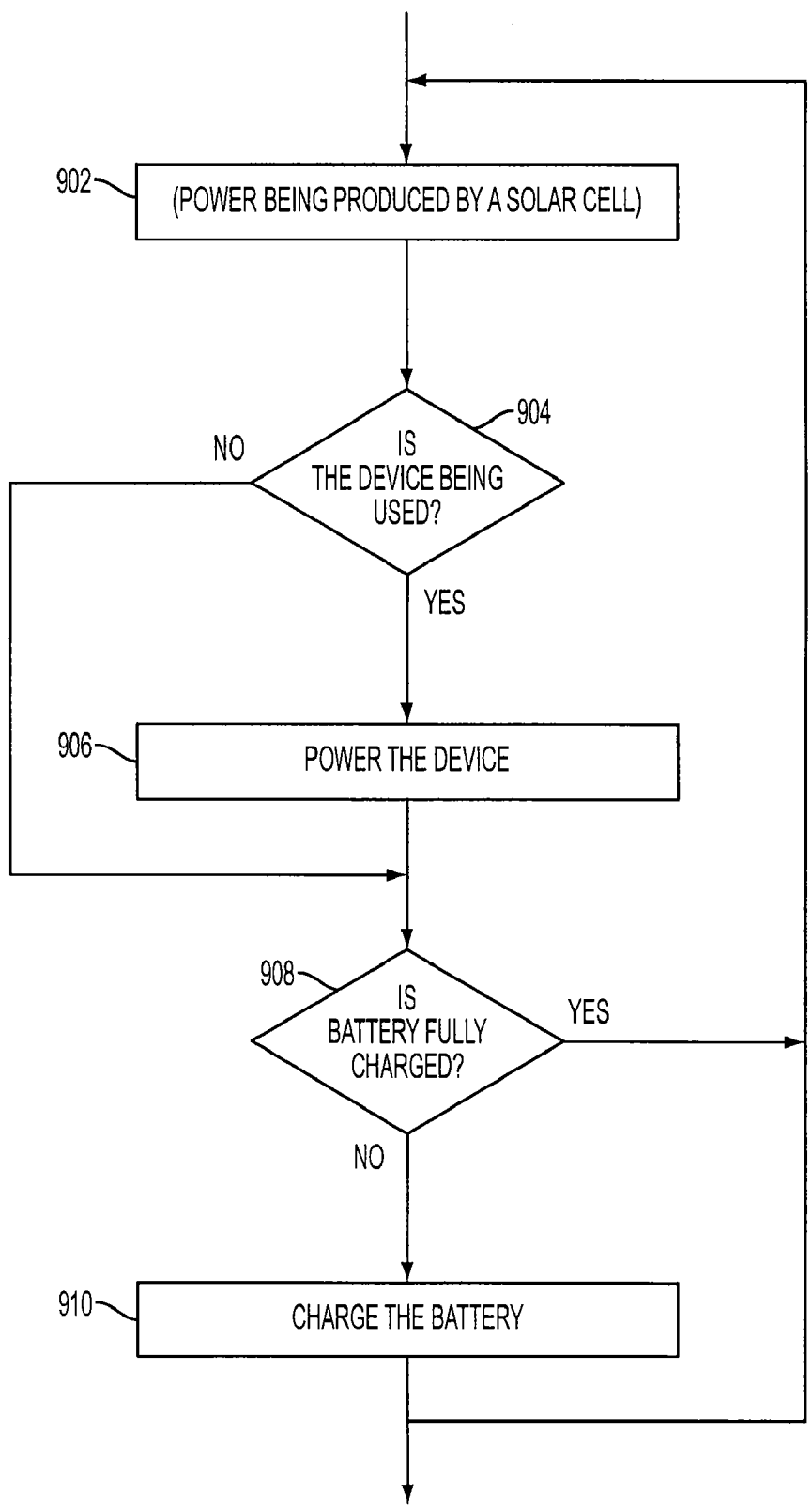
FIG. 9 is a flow chart illustrating an exemplary process for power management according to some embodiments of the invention.

FIG. 9 illustrates the flow of electricity in a device powered by solar cells according to an embodiment of the present invention. As with the "traffic control" unit 808 of FIG. 8, this flow chart may not represent any concrete process that needs to be implemented with extra circuitry. This chart may be viewed as an illustration of the internal process of the power flow in an exemplary device such as those depicted in FIG. 8. In some embodiments, however, this process may be implemented with explicit functional units, possibly with configurable options and/or with associated user interfaces. The exemplary process of FIG. 9 starts when the solar cells are exposed to bright light and the solar cells generate electricity as indicated in a block 902. When the device is being used, the instantaneous electric power generated from the solar cells may be used to directly power the device, at blocks 904 and 906. If not, following the No branch from block 904, the generated energy may be used to charge the batteries, at 910. Any leftover electricity after powering the device, 906, may also be used to charge the batteries. If the batteries are currently fully charged, the electric power generated from the solar cell will not be used, and the process returns to the beginning following the Yes branch at block 908. Otherwise, the generated solar energy is used to charge the batteries at 910. In cases where this process is implemented with additional functional units, the decision blocks such as 904 and 908 may be overridden by system settings and/or by user-provided options.

Figure 10:
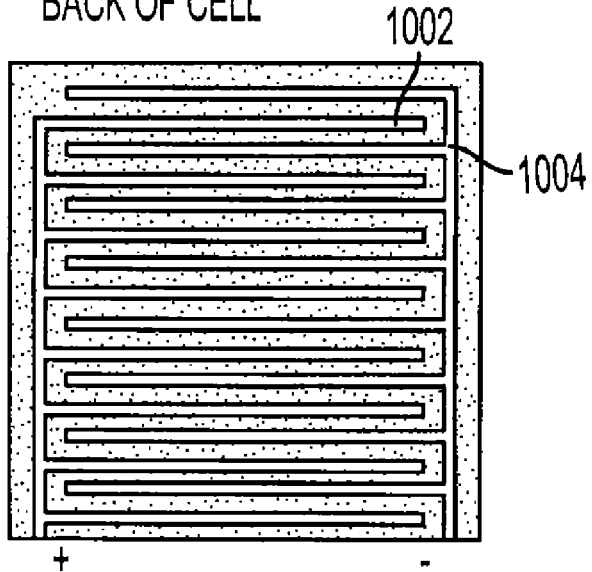
FIG. 10 illustrates an exemplary electrode pattern for a solar panel according to some embodiments of this invention.

FIG. 10 illustrates a typical electrode configuration for a solar panel. The electrodes 1002 and 1004 are in a rectilinear pattern. The electrodes 1002 and 1004 are typically arranged on one side (which will be referred to as the electrode side) of the solar panel. The side opposite the electrode side is typically the solar energy collection medium, which is typically doped silicon or a solar polymer (this will be referred to as the collection side of the solar panel). Although this electrode pattern may be useful for collecting solar energy, it may not be ideal as a touch sensor pattern since there are one two separate connected metal areas that may form a single quadrant or touch pixel.

Figure 11:
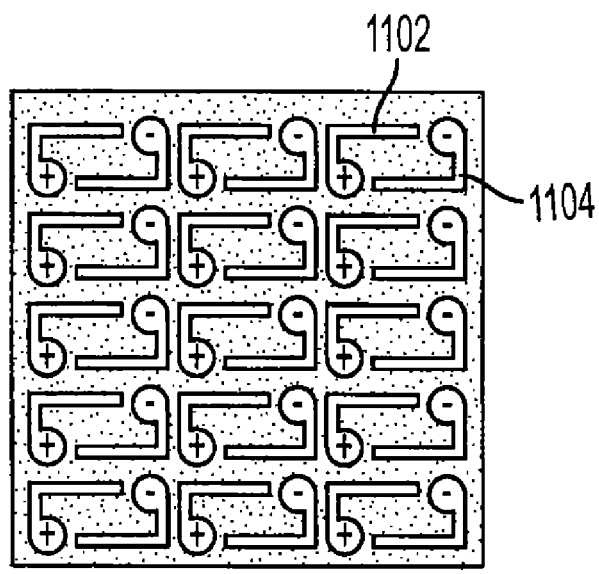
FIG. 11 illustrates an exemplary electrode pattern for both solar energy collection and touch sensing and connected to various components of an electronic device.

FIG. 11 illustrates an electrode pattern including electrodes 1102 and 1104 that may be used for an integrated solar panel and touch array according to embodiments of this invention. This configuration provides the same electrode coverage as the electrode pattern shown in FIG. 10, but provides far more quadrants or pixels that may be used as touch sensors. In this configuration the electrode terminals may be connected in parallel in order to draw power from the cell during a solar power cycle. The terminals may then be connected as separate quadrants during a touch sensor cycle. This configuration may provide far more touch sensing resolution than the electrode configuration in FIG. 10.

Figure 12:
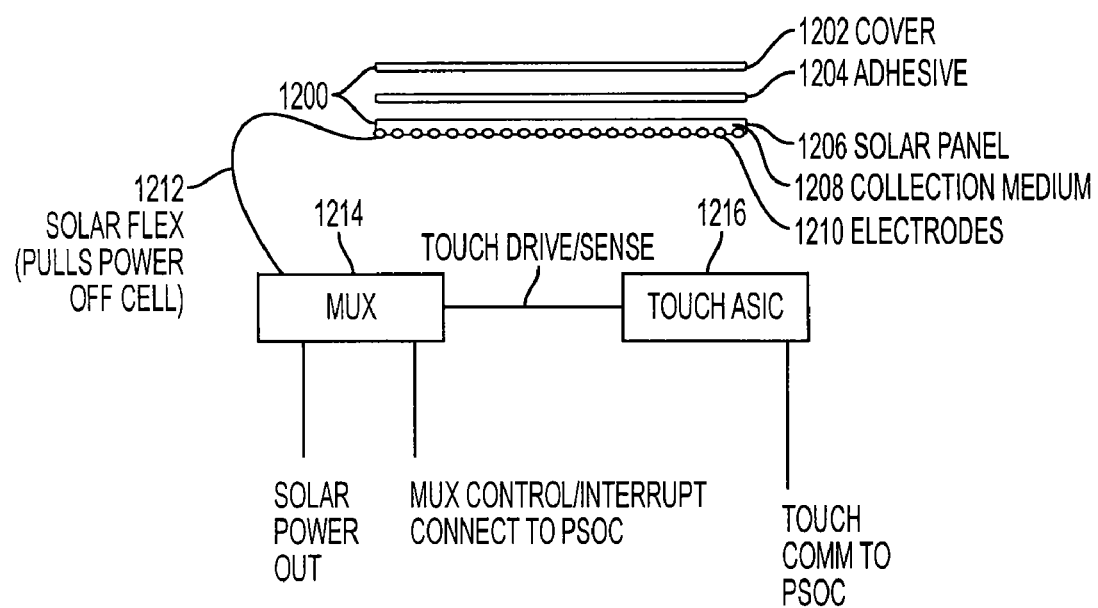
FIG. 12 illustrates an exemplary integrated solar panel and touch sensor stack-up according to embodiments of this invention.

FIG. 12 illustrates an integrated solar panel and touch sensor stack-up according to embodiments of this invention. In FIG. 12, the stack-up 1200 includes a solar 1206 that includes a collection side 1208 and an electrode side 1210. The collection side may include any typical solar collection medium including, for example, silicon and polymer mediums. The electrodes 1210 may be on the rear side of the solar panel 1206. The solar panel 1206 may be adhered to a cover glass 1202 using a transparent adhesive 1204. Power from the solar panel and touch sensing signals may be drawn from electrodes 1210 using a single flex 1212.

The flex 1212 connects the electrodes 1210 to multiplexer (MUX) 1214. The MUX 1214 may include circuitry that selectively switches between power conversion circuitry and touch sensing circuitry during power and touch sensing cycles respectively. The MUX 1214 may take touch sensing signals provided by electrodes 1210 during touch sensing cycles and provides these signals to touch sensor circuitry 1216. Similarly, the MUX 1214 may take power from solar panel 1206 and supplies it to a power management unit during solar power cycles.

Figure 13:
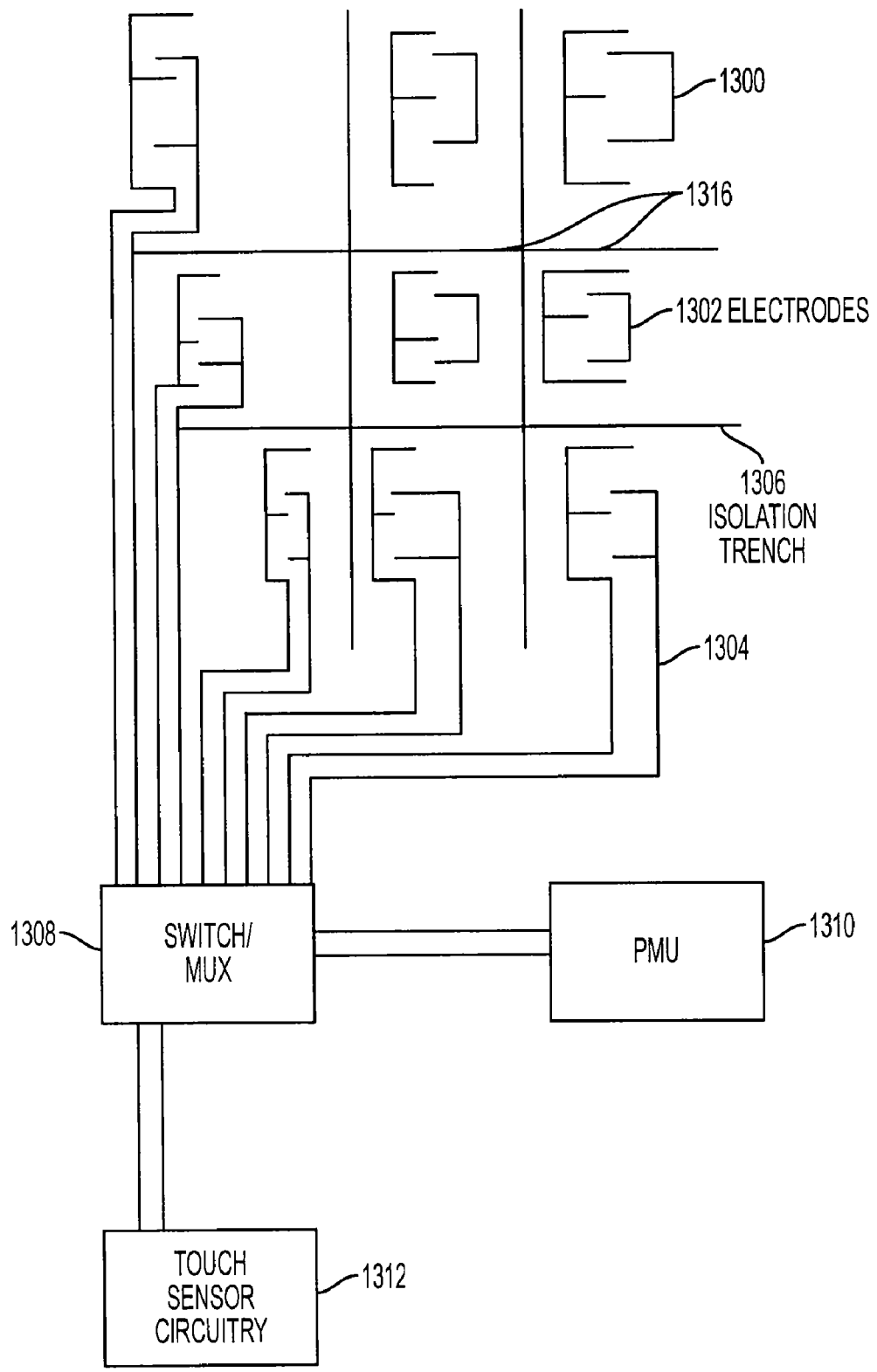
FIG. 13 illustrates an exemplary integrated solar panel and touch sensor array that includes electrodes in a self capacitance arrangement used for both solar energy collection and touch sensing according to embodiments of this invention.

FIG. 13 illustrates an integrated solar panel and touch sensor array 1300 that includes electrodes 1302 in a self capacitance arrangement used for both solar energy collection and touch sensing according to embodiments of this invention. Isolation trench 1306 divides the electrodes into separate solar cells and touch pixels.

The electrodes 1302 may be routed to MUX 1308 using traces 1306. The traces may be 1306 may be routed around the electrode array. In addition, or alternatively, vias may be used to route the traces down to another routing layer to for routing the electrodes to the multiplexer/switch 1310. The MUX 1308 takes touch sensing signals provided by electrodes 1302 during touch sensing cycles and provides these signals to touch sensor circuitry 1312. Similarly, the MUX 1308 takes power from solar panel 1300 and supplies it to power management unit (PMU) 1310 during solar power cycles. The PMU 1310 may utilize the power to power the device and/or recharge the devices power supply.

Figure 14:
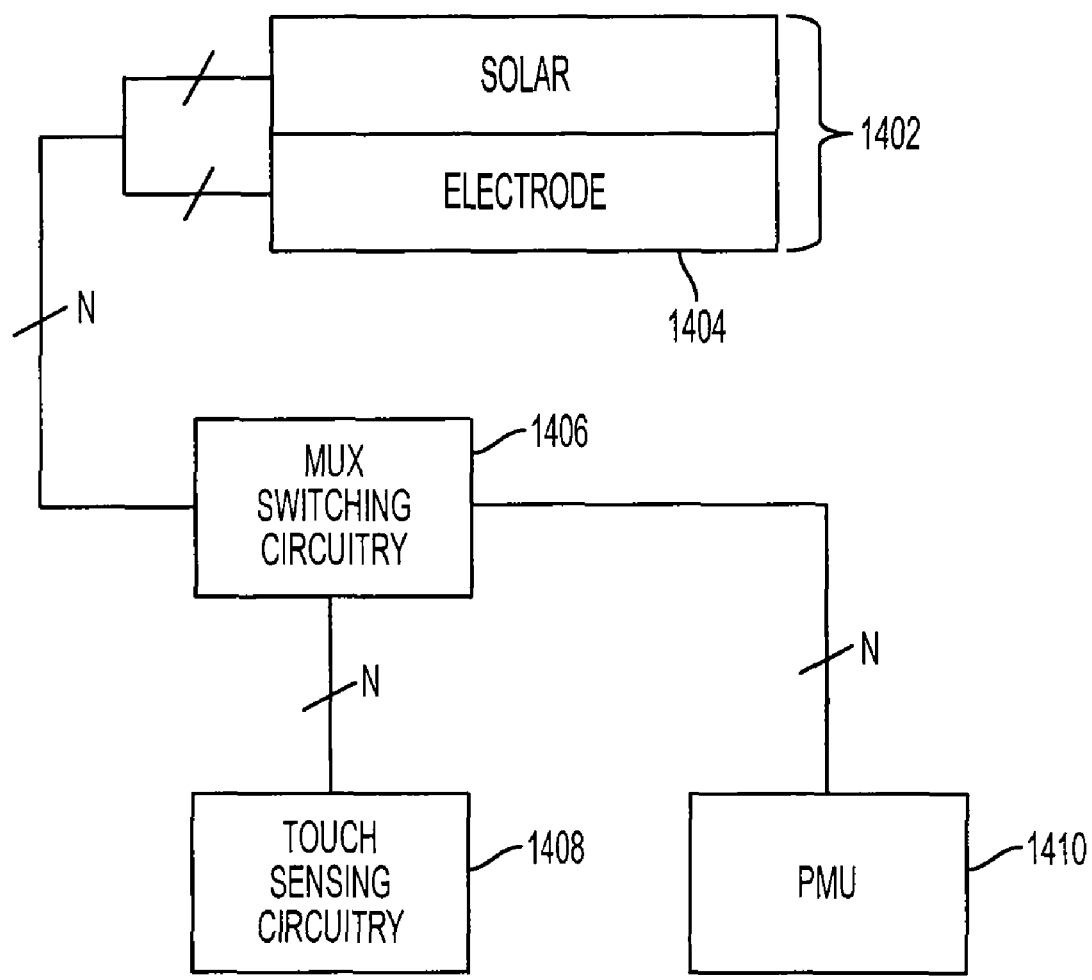
FIG. 14 illustrates an exemplary block diagram illustrating a MUX switching circuitry connected to touch sensing circuitry and power circuitry.

FIG. 14 illustrates a block diagram illustrating the MUX switching circuitry 1406 connected to touch sensing circuitry 1408 and power circuitry 1410. In FIG. 14 the MUX 1406 is connected to electrode 1404 of solar panel 1402. The MUX sends touch sensing signals to touch sensing circuitry 1408 during touch sensing cycles and sends power to PMU 1410 during power cycles. The MUX circuitry may share components with the touch sensing circuitry 1408 and/or the PMU 1410. For example, Some of the power fets of the PMU circuitry may be used as part of the MUX switching circuitry 1406.

Figure 15:
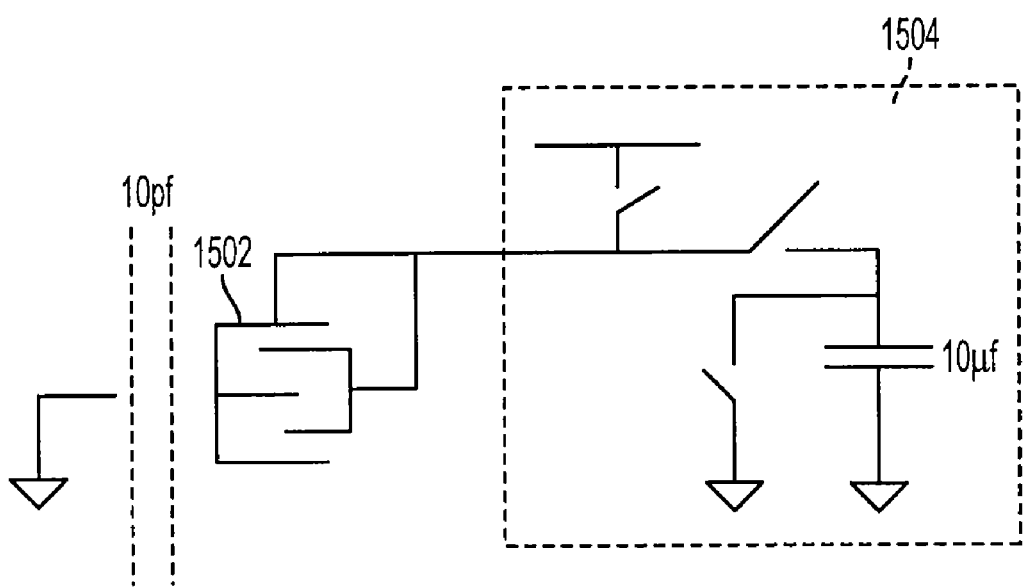
FIG. 15 illustrates an exemplary electrode connected for self capacitance touch sensing according to embodiments of this invention.

FIG. 15 illustrates a detailed view of one electrode 1502, connected for self capacitance touch sensing according to embodiments of this invention. Some of the self touch sensing transistors 1504 used for self capacitance testing may also be part of the switching (MUX) circuitry.

Figure 16:
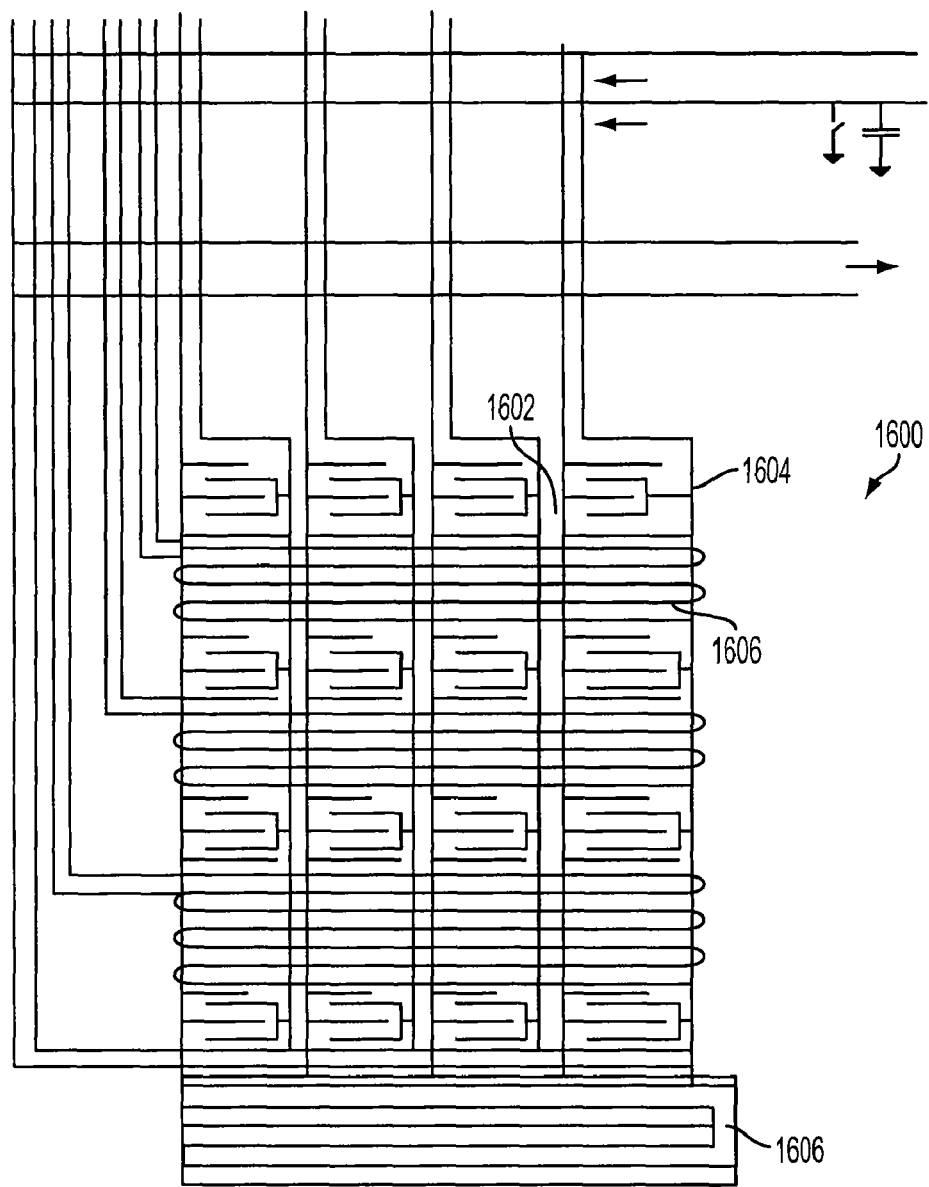
FIG. 16 illustrates an exemplary integrated solar panel and touch sensor array that includes electrodes in a mutual capacitance arrangement used for both solar energy collection and touch sensing according to embodiments of this invention.

FIG. 16 illustrates an integrated solar panel and touch sensor array 1600 that includes electrodes 1602 and 1604 in a mutual capacitance arrangement used for both solar energy collection and touch sensing according to embodiments of this invention. The electrode pattern may be formed on a single layer with electrodes 1602 operating as drive lines and electrodes 1604 operating as sense lines or vice versa. Traces 1606 may be routed around the electrode array on the same layer and/or the traces 1606 may be routed on a separate layer.

Figure 17A:
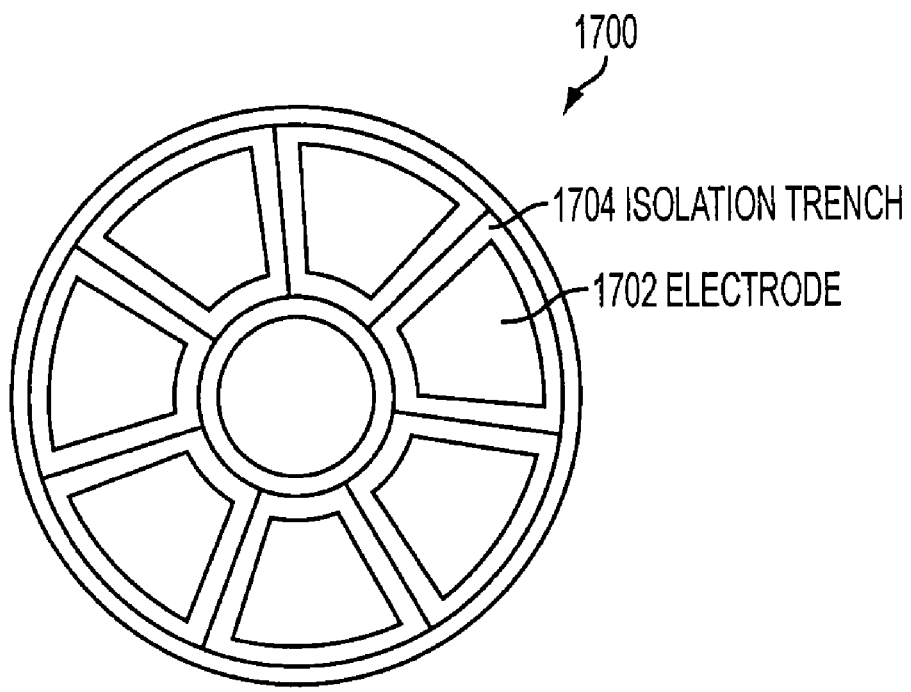
FIG. 17a illustrate an exemplary electrode side of an integrated solar panel and touch sensor array that includes electrodes used for both solar energy collection and touch sensing according to embodiments of this invention.
Figure 17B:
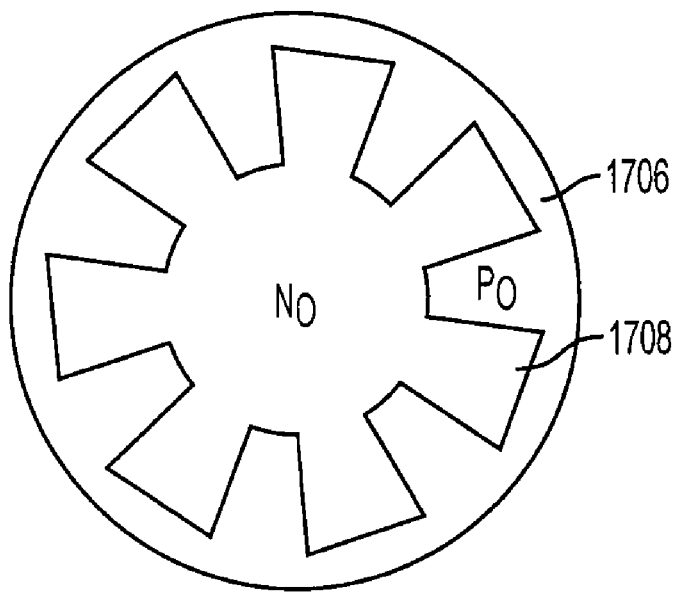
FIG. 17b illustrates an exemplary collection side of an integrated solar panel and touch sensor array that includes electrodes used for both solar energy collection and touch sensing according to embodiments of this invention.

FIGS. 17a and 17b illustrate an integrated solar panel and touch sensor array 1700 that includes electrodes 1702 used for both solar energy collection and touch sensing according to embodiments of this invention. FIG. 17a illustrates the electrode side of the solar panel and FIG. 17b illustrates the collection side of the solar panel. The electrodes in this embodiment are circumferentially arranged around a circular surface in a scroll wheel configuration. Isolation trench 1704 divides the electrodes into separate solar cells and touch pixels. Traces for the electrodes 1702 may be routed around the electrode array and/or routed on a layer separate from the electrodes. FIG. 17b illustrates that the collection side of the solar panel that includes both a P type region 1706 and an N type region 1708.

In addition to being used for capacitive sensing, the integrated touch sensor and solar panel configurations may also be used for optical sensing. Unlike the capacitive sensing, the optical sensing may be accomplished simultaneously with power production. Accordingly, optical sensing may be used to increase the amount of time that the solar panel is used to produce energy.

For example, the solar panel may operate in a solar power and optical sensing mode. When an approaching object, such as a finger, is detected the solar panel may switch to a capacitive sensing mode to more precisely locate the object. Alternatively, the solar panel may cycle between solar power/optical sensing mode and capacitive sensing mode. When no object is detected by optical sensing or capacitive sensing the number of capacitive cycles in a given time interval may be decreased to maximize the amount of time the solar panel is used to produce energy. When an approaching object is detected using either optical sensing or capacitive sensing, the number of capacitive sensing cycles in a given time period may be increased to provide better accuracy and response for the capacitive sensing.

Figure 18A:
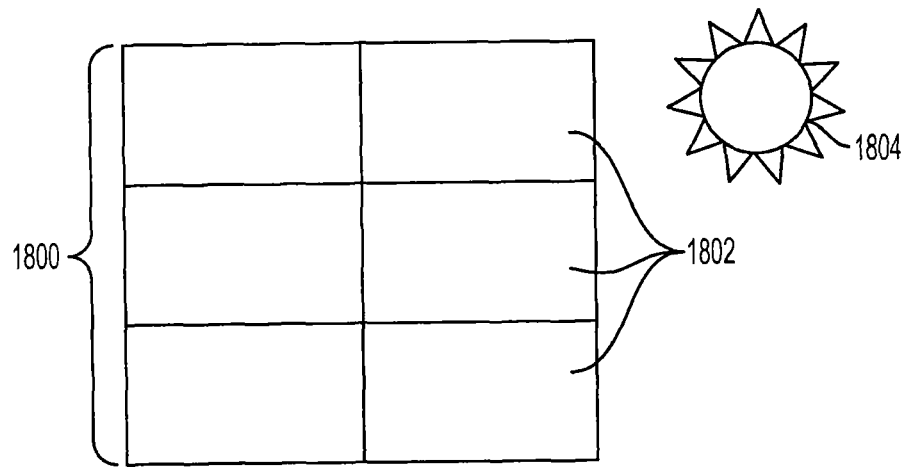
FIG. 18a illustrates an exemplary solar panel that is completely exposed to a light source according to embodiments of this invention.
Figure 18B:
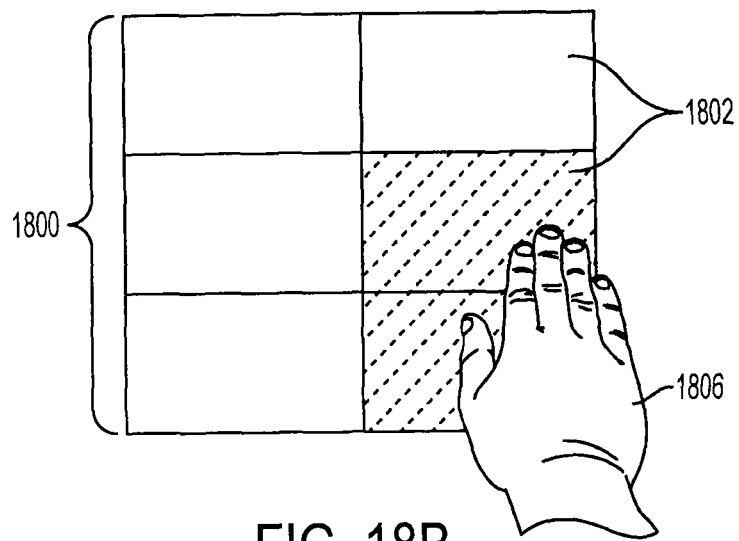
FIG. 18b illustrates an exemplary solar panel that is partially shaded by a user's finger according to embodiments of this invention.
Figure 18C:
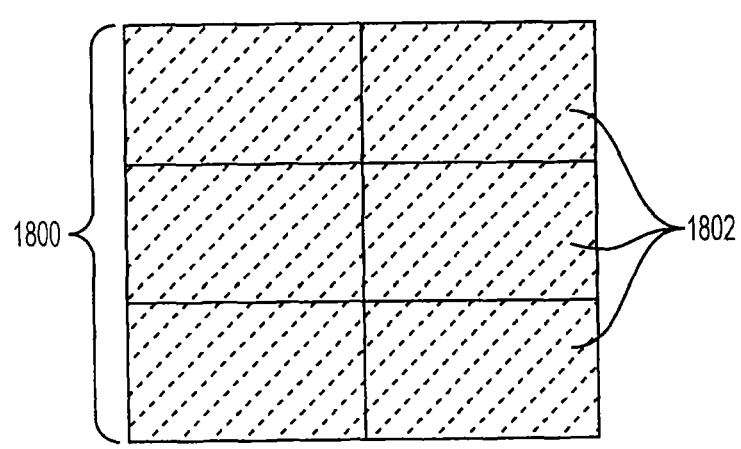
FIG. 18c illustrates an exemplary solar panel that is completely shaded according to embodiments of this invention.

FIGS. 18a-18c illustrate optical sensing and power production using a solar panel according to embodiments of this invention. Touch panel 1800 includes six electrode quadrants 1802. In FIG. 18a the solar panel is completely exposed to a light source 1804 and all six electrode quadrants 1802 are producing electricity more or less equally. In this configuration that MUX can be in a power mode that maximizes the amount of time spent in solar power/optical sensing cycles in a given time period.

In FIG. 18b an incoming object 1806, such as a user finger, blocks one or more electrodes 1802 of solar panel 1806. An algorithm may then be used to switch the device to a touch sensing mode that increases the number of touch sensing cycles in a given period.

In FIG. 18c all of the electrode quadrants 1802 are shaded. This could occur when the user changes lighting conditions. The algorithm can be programmed to determine whether the change in conditions is an incoming object or just a change in lighting conditions. This determination can, for example, be based on the number of electrodes that are affected and the duration of the change in conditions.

Figure 19:
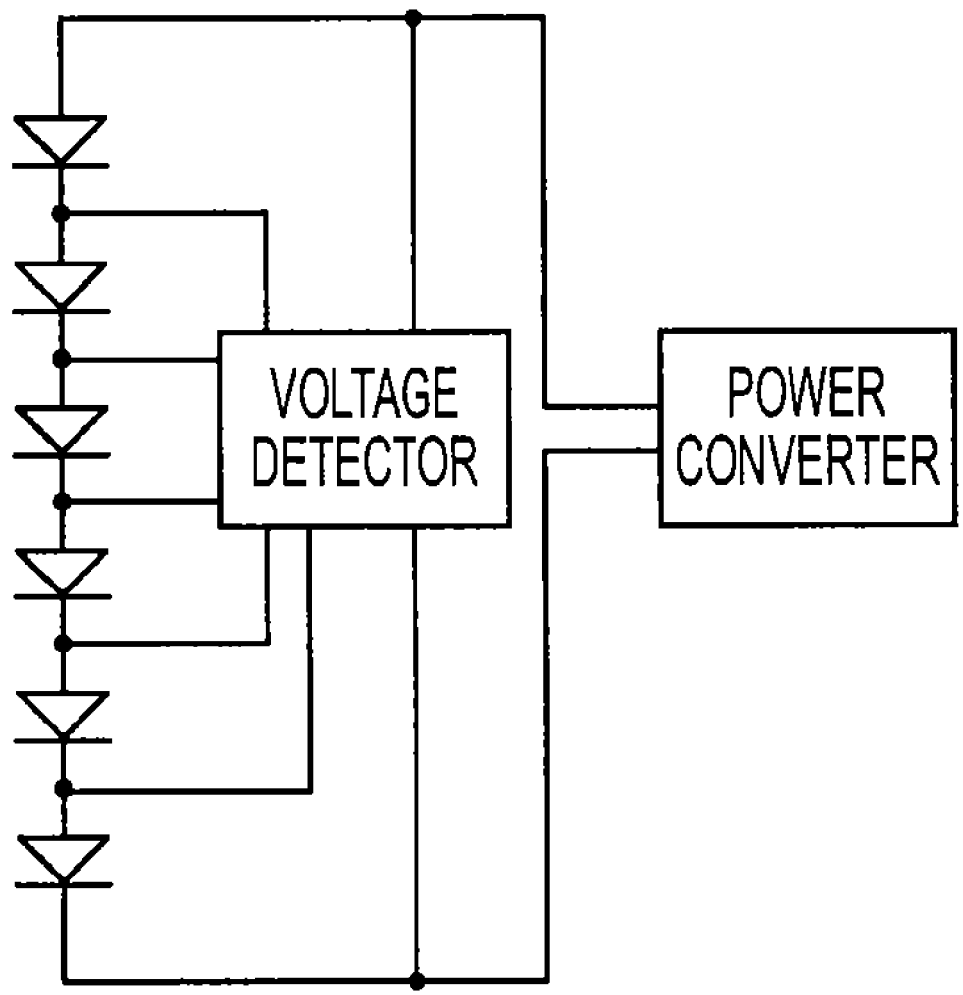
FIG. 19 illustrates an exemplary series mode arrangement for electrodes used for optical sensing according to embodiments of this invention.

Optical sensing may be performed in a "parallel mode" or a "series mode." In parallel mode, the electrodes may function collectively to determine optical events. Thus, if any one of the electrodes does not provide voltage or current, the collective output of the solar cell drops, thus potentially indicating an optical sense event such as an incoming object. In series mode, it is possible to determine which electrode is not receiving as much light as the other electrodes. FIG. 19 illustrates a series mode arrangement for electrodes used for optical sensing according to embodiments of this invention.

FIG. 20a illustrates an exemplary handheld media player including an integrated touch sensor solar cell panel surface 2004 that substantially fills the front surface 2002 of the housing of media player 2000. The handheld media player in FIG. 20b includes a small LED panel 2006, which indicates the mode of the media player. The handheld media player in FIG. 20c includes icons 2008 on the cover glass of integrated touch sensor solar cell panel surface 2004. Icons 2008 indicate where on the surface a user may press to control the media player. Icons 2008, may for example be embossed, etched, or glued onto the surface of the solar cell 2004.

FIG. 21 illustrates an exemplary handheld media player that includes an integrated touch sensor solar cell panel surface 2102 and an integrated touch sensor LCD display surface 2104 on a front surface 2100 of the media player. FIG. 22 illustrates an exemplary handheld media player that includes an integrated touch sensor solar cell panel surface 2202 and a LCD display surface 2204 on a front surface 2200 of the media player.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An integrated solar cell panel and touch sensor comprising:
   a solar panel comprising an electrode pattern and a solar energy collection medium; and
   switching circuitry configured to switch the electrode pattern between a touch sensing mode and a solar energy collection mode.

2. The integrated solar panel and touch sensor of claim 1, wherein the touch sensing mode comprises mutual capacitance sensing.

3. The integrated solar panel and touch sensor of claim 1, wherein the electrode pattern comprises drive lines and sense lines.

4. The integrated solar panel and touch sensor of claim 1, wherein the electrode pattern is circumferentially arranged around a circular surface.

5. The integrated solar panel and touch sensor of claim 1, wherein the circuitry is configured to optically detect an object based on a change in voltage or current produced in the solar energy collection mode.

6. The integrated solar panel and touch sensor of claim 5, wherein the circuitry switches the electrode pattern from the touch sensing mode to the solar energy collection mode based on the optical detection.

7. The integrated solar panel and touch sensor of claim 5, wherein the circuitry is configured to increase a touch sensing rate when an object is optically detected.

8. A solar cell panel and touch sensor comprising:
   a solar panel, the solar panel operative for power production;
   an electrode pattern comprising a capacitance sensor array; and
   circuitry configured to optically detect an incoming object based on a change in voltage or current produced by the solar panel, and configured to capacitively sense the position of the object utilizing the electrode pattern;
   wherein the electrode pattern is part of the solar panel; and
   wherein the circuitry is configured to switch the electrode pattern between a touch sensing mode and a solar energy collection mode based on the optical detection.

9. The solar panel and touch sensor of claim 8, wherein the electrode pattern comprises drive lines and sense lines.

10. The solar panel and touch sensor of claim 8, wherein the electrode pattern is circumferentially arranged around a circular surface.

11. The solar panel and touch sensor of claim 8, wherein the circuitry is configured to increase a rate of capacitance sensing when an object is optically detected.

12. A method of collecting solar energy and detecting an objects position comprising:
   collecting solar energy using a solar panel, the solar panel operative for power production;
   optically detecting an incoming object by a change in voltage or current produced by the solar panel; and
   capacitively sensing the position of the object utilizing an electrode pattern;
   wherein the electrode pattern is part of the solar panel; and
   wherein the method further comprises:
   switching the electrode pattern between a touch sensing mode and a solar energy collection mode based on the optical detection.

13. The method of claim 12, wherein the electrode pattern comprises drive lines and sense lines.

14. The method of claim 12, wherein the electrode pattern is circumferentially arranged around a circular surface.

15. The method of claim 12, wherein a rate of capacitively sensing the position of the object is based on optically detecting the incoming object.

16. A portable electronic device comprising:
   a housing; and
   an integrated solar cell panel and touch sensor comprising a solar panel comprising an electrode pattern and a solar energy collection medium within a front surface of the housing, and switching circuitry configured to switch the electrode pattern between a touch sensing mode and a solar energy collection mode.

17. The portable electronic device of claim 16, wherein the integrated solar cell panel and touch sensor substantially fills the front surface of the housing.

18. The portable electronic device of claim 16, wherein the housing further comprising a transparent cover that covers the integrated solar cell panel and touch sensor.

19. The portable electronic device of claim 18, wherein the cover comprises icons that indicate where on the front surface a user may press to control the portable electronic device.

20. The portable electronic device of claim 19, wherein the icons are embossed or etched onto the surface of the transparent cover.

21. The portable electronic device of claim 16, further comprising a display on the front surface of the housing.

22. The portable electronic device of claim 16, wherein the portable electronic device is a PDA, phone, or media player.

23. A solar cell panel comprising:
   a solar panel having an electrode pattern, the solar panel operative for power production; and
   circuitry configured to optically detect an incoming object based on a change in voltage or current produced by the solar panel and for switching the electrode pattern between a touch sensing mode and a solar energy collection mode;

wherein the circuitry is configured in the solar energy collection mode to simultaneously operate the solar panel for power production and for optical detection.

24. A solar cell panel and touch sensor comprising:

a solar panel having an electrode pattern, the solar panel operative for power production;

the electrode pattern comprising a capacitance sensor array; and circuitry configured to optically detect an incoming object based on a change in voltage or current produced by the solar panel, and configured to capacitively sense the position of the object utilizing the electrode pattern;

wherein the circuitry is configured to control the solar panel for simultaneous operation for power production and for optical detection; and wherein the circuitry is configured to switch the electrode pattern between a touch sensing mode and a solar collection mode based on the optical detection.

25. The solar panel and touch sensor of claim 24, wherein the electrode pattern comprises drive lines and sense lines.

26. The solar panel and touch sensor of claim 24, wherein the electrode pattern is circumferentially arranged around a circular surface.

27. A method of collecting solar energy and detecting an object's position comprising:

collecting solar energy using a solar panel having an electrode pattern, the solar panel operative for power production;

optically detecting an incoming object by a change in voltage or current produced by the solar panel;

capacitively sensing the position of the object utilizing the electrode pattern;

simultaneously collecting the solar energy for power production and for optically detecting; and switching the electrode pattern between a touch sensing mode and a solar energy collection mode based on the optical detection.

28. The method of claim 27, wherein the electrode pattern comprises drive lines and sense lines.

29. The method of claim 27, wherein the electrode pattern is circumferentially arranged around a circular surface.

30. The method of claim 27, wherein a rate of capacitively sensing the position of the object is based on optically detecting the incoming object.

* * * * *